(12) United States Patent
Shirai

(10) Patent No.: US 8,507,373 B2
(45) Date of Patent: Aug. 13, 2013

(54) SEMICONDUCTOR DEVICE INCLUDING TRANSISTORS OF DIFFERENT JUNCTION DEPTH, AND METHOD OF MANUFACTURING THE SAME

(75) Inventor: Hiroki Shirai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 175 days.

(21) Appl. No.: 12/929,738

(22) Filed: Feb. 11, 2011

(65) Prior Publication Data
US 2011/0156164 A1 Jun. 30, 2011

Related U.S. Application Data

(63) Continuation of application No. 12/458,633, filed on Jul. 17, 2009, now Pat. No. 7,911,005.

(30) Foreign Application Priority Data

Jul. 18, 2008 (JP) ................................. 2008-187820

(51) Int. Cl.
*H01L 21/425* (2006.01)
*H01L 21/8238* (2006.01)

(52) U.S. Cl.
USPC ...................... 438/529; 438/210; 257/E21.66

(58) Field of Classification Search
USPC .................... 438/200, 210, 529; 257/E21.66
See application file for complete search history.

(56) References Cited

U.S. PATENT DOCUMENTS

| 5,998,247 | A | * | 12/1999 | Wu | 438/200 |
| 6,004,842 | A | | 12/1999 | Ikemasu et al. | |
| 6,576,521 | B1 | * | 6/2003 | Chaudhry et al. | 438/303 |
| 2004/0126968 | A1 | * | 7/2004 | Kito | 438/257 |
| 2005/0009258 | A1 | * | 1/2005 | Inoue et al. | 438/200 |

FOREIGN PATENT DOCUMENTS

| JP | 2001-127270 | 5/2001 |
| JP | 2005-116582 | 4/2005 |

\* cited by examiner

*Primary Examiner* — Daniel Luke
(74) *Attorney, Agent, or Firm* — McGinn IP Law Group, PLLC

(57) ABSTRACT

A semiconductor device having a DRAM region and a logic region embedded together therein, including a first transistor formed in a DRAM region, and having a first source/drain region containing at least a first impurity, and a second transistor formed in a logic region, and having a second source/drain region containing at least a second impurity, wherein each of the first source/drain region and the second source/drain region has a silicide layer respectively formed in the surficial portion thereof, and the first source/drain region has a junction depth which is determined by an impurity and is deeper than the junction depth of the second source/drain region.

10 Claims, 6 Drawing Sheets

SEMICONDUCTOR DEVICE INCLUDING TRANSISTORS OF DIFFERENT JUNCTION DEPTH, AND METHOD OF MANUFACTURING THE SAME

The present application is a Continuation application of U.S. patent application Ser. No. 12/458,633, filed on Jul. 17, 2009 now U.S. Pat. No. 7,911,005.

This application is based on Japanese patent application No. 2008-187820 the content of which is incorporated hereinto by reference.

BACKGROUND

1. Technical Field

The present invention relates to a semiconductor device and a method of manufacturing the same.

2. Related Art

In recent years, there have been known semiconductor devices having a DRAM region in which a DRAM (Dynamic Random Access Memory) is formed, and a logic region in which a CMOS (Complementary Metal Oxide Semiconductor) and so forth are formed, embedded together.

Japanese Laid-Open Patent Publication No. 2005-116582 describes a non-volatile memory cell containing a MONOS transistor for storing data and a MIS transistor for selecting the memory cell, configured so as to have a nitrogen doped region, while being aligned with the gate electrode of the MONOS transistor. According to the configuration, leakage current of the MONOS transistor may reportedly be reduced.

Japanese Laid-Open Patent Publication No. 2001-127270 describes a DRAM-embedded semiconductor device having a DRAM section and a logic section formed on a single substrate, configured to have a silicide layer formed in the surficial portion of each of impurity-diffused regions, both in the logic section and the DRAM section. Formation of the silicide layers in the surficial portions of the impurity-diffused regions raises an effect of reducing contact resistance.

The present inventor has recognized as follows. Formation of the silicide layers in the surficial portions of the impurity-diffused regions raises a problem in that the leakage current may flow between the silicide layers and the substrate unless the impurity-diffused layers are formed to a sufficient depth, and thereby the data retention characteristics of DRAM may degrade.

FIGS. 6A and 6B are drawings schematically illustrating a configuration of an impurity-diffused layer of a transistor. FIG. 6A is a plan view illustrating a gate and an impurity-diffused layer, and FIG. 6B is a sectional view taken along line A-A' in FIG. 6A. As illustrated in FIG. 6B, a silicide layer may be varied in the thickness, in the process of formation thereof. Variations in the thickness of the silicide layer may be causative of leakage current between a portion of the silicide layer having a large depth, and the substrate. Since the amount of leakage is determined by the minimum distance between the silicide layer and the junction, so that an insufficient depth of the impurity-diffused layer, and consequently shortened distance between the silicide layers and the junction, may increase the amount of leakage, and may degrade data retention characteristics.

On the other hand, the junction is required to be shallowest as possible in the logic region, in order to shorten the gate length of the transistors. Accordingly, it has been demanded that the impurity-diffused layer is formed deeper in the DRAM region, and shallower in the logic region.

SUMMARY

According to the present invention, there is provided a semiconductor device having a DRAM region and a logic region embedded together therein, comprising:

a substrate having the DRAM region and the logic region formed therein;

a first transistor formed in the DRAM region of the substrate, and having a first source/drain region containing arsenic and phosphorus as impurities; and a second transistor formed in the logic region of the substrate, and having a second source/drain region containing at least arsenic as an impurity, wherein each of the first source/drain region and the second source/drain region of the substrate has a silicide layer respectively formed in the surficial portion thereof, and the first source/drain region has a junction depth which is determined by phosphorus and is deeper than the junction depth of the second source/drain region.

According to the present invention, there is provided also a method of manufacturing a semiconductor device having a DRAM region and a logic region embedded together therein, the method comprising:

forming a gate electrode in each of the DRAM region and the logic region formed in a substrate;

introducing impurity ions by ion implantation respectively into the logic region and the DRAM region, while using the gate electrodes as a mask;

allowing the impurities to diffuse by annealing, to thereby form a first source/drain region and a second source/drain region respectively in the DRAM region and the logic region; and forming a silicide layer in the surficial portion of each of the first source/drain region and the second source/drain region, wherein in the introducing the impurities by ion implantation, arsenic and phosphorus are introduced into the DRAM region as the impurities, and at least arsenic is introduced into the logic region as the impurity, so that the junction depth in the first source/drain region is determined by phosphorus, and is made deeper than the junction depth of the second source/drain region.

When an n-type, impurity-diffused layer is formed, impurities generally adoptable thereto may be phosphorus, arsenic and so forth. One possible method of making difference in the depth of the source/drain region, which is the impurity-diffused layer, between the DRAM region and the logic region, may be such as making difference in doses of these impurities from each other. Arsenic dose may, however, preferably be raised to a certain extent, in view of ensuring the ON-current of the transistor. Another problem may arise when the silicide layer is formed over the impurity-diffused layer, in that the silicide layer is not desirably formed if the arsenic concentration is high in the surficial portion of the impurity-diffused layer. Moreover, because of a slow diffusion speed of arsenic, the junction depth cannot be increased even if the arsenic concentration is elevated, leaving the arsenic concentration high in the surficial portion of the impurity-diffused layer. The present inventors found out a technique of selectively deepening the junction depth in the DRAM region as compared with that in the logic region, by selectively making difference in phosphorus concentration between the DRAM region and the logic region, and reached to provide the present invention.

Accordingly, the silicide layer may be formed in a desirable manner in the surficial portion of the impurity-diffused layer, and the leakage between the silicide layer and the substrate may be suppressed, and thereby the data retention characteristics of DRAM may be improved, even if non-uniformity resides in the thickness of the silicide layer in the DRAM region. Since it is no more necessary to alter the arsenic concentration for the purpose of deepening the junction depth in the DRAM region, so that the arsenic concentration may be set in a desirable range enough to allow easy formation of the silicide layer, and enough to ensure a necessary level of ON-current.

The semiconductor device herein is configured to embed the DRAM region having memory elements and a logic circuit as a peripheral circuit for controlling the memory elements; and the logic region which is different from the DRAM region. The logic region is not the same with the peripheral circuit disposed around the memory elements in the DRAM region, but contains a logic circuit formed in a region different from the DRAM region. The logic region may be, for example, a high-speed logic circuit such as CPU (Central Processing Unit), or may be a region having CMOS (Complementary Metal Oxide Semiconductor) or the like formed therein.

Note that also any arbitrary combination of the above-described constituents, and any exchanges between the expression of the present invention among method, device and so forth, may be valid as embodiments of the present invention.

According to the present invention, a semiconductor device having a DRAM region and a logic region embedded together therein, and having a silicide layer formed in the surficial portion of the source/drain region, may be improved in the data retention characteristics of DRAM, while keeping characteristics of the logic region at a desirable level.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
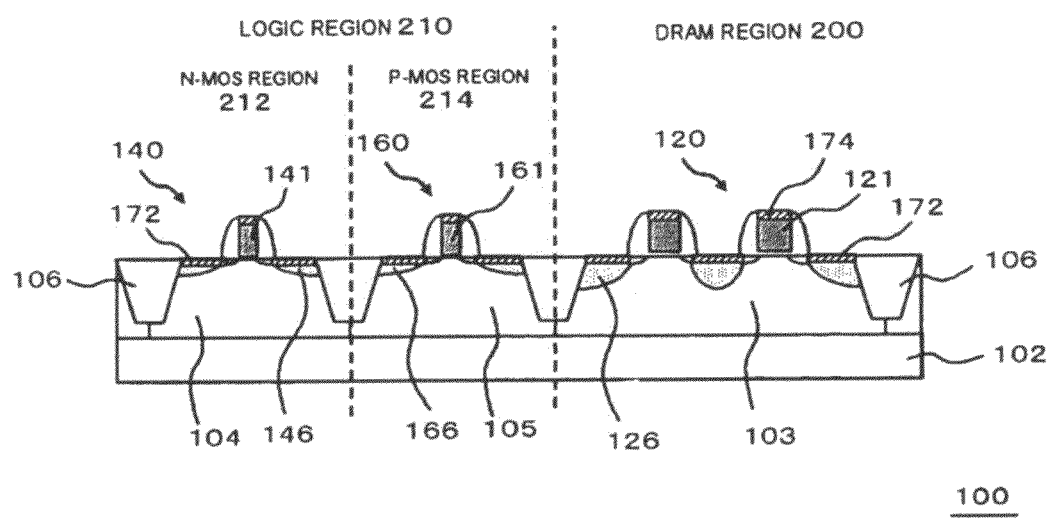
FIG. 1 is a sectional view illustrating a configuration of a semiconductor device in one embodiment of the present invention.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

An embodiment of the present invention will be explained referring to the attached drawings. Note that, in all drawings, any similar constituents will be given with the same reference numerals or symbols, and explanations thereof will not be repeated.

FIG. 1 is a sectional view illustrating a configuration of a semiconductor device 100 of this embodiment.

The semiconductor device 100 is configured to have a DRAM region 200 having a DRAM cell, and a logic region 210 having a CMOS embedded together therein. The logic region 210 is provided with an NMOS region 212 and a PMOS region 214. One NMOS and one PMOS configure one CMOS.

The semiconductor device 100 includes a semiconductor substrate 102 (substrate); and a cell P-well 103, a P-well 104, and an N-well 105 formed in the semiconductor substrate 102. The DRAM region 200 corresponds to the cell P-well 103, and the NMOS region 212 and the PMOS region 214 in the logic region 210 correspond to the P-well 104 and the N-well 105, respectively. The cell P-well 103, the P-well 104, and the N-well 105 are isolated by element isolation insulating layers 106. The cell P-well 103 and the P-well 104 typically contain boron or indium (In) as an impurity. The N-well 105 typically contains phosphorus and/or arsenic as an impurity.

The semiconductor device 100 includes a first transistor 120, formed in the DRAM region 200, a second transistor 140 formed in the NMOS region 212, and a third transistor 160 formed in the PMOS region 214.

The first transistor 120 includes a first source/drain region 126 containing arsenic (As) and phosphorus (P) as impurities, and a gate including first gate electrodes 121. The second transistor 140 includes a second source/drain region 146 containing As and P as impurities, and a gate including a second gate electrode 141. The third transistor 160 includes a third source/drain region 166 containing boron (B) as an impurity, and a gate including a third gate electrode 161. Each of the first source/drain region 126, the second source/drain region 146, and the third source/drain region 166 has a silicide layer 172, respectively in the surficial portions thereof. The first gate electrodes 121, the second gate electrode 141, and the third gate electrode 161 are composed of polysilicon, and each of which have a silicide layer 174 formed on the surface thereof.

In this embodiment, the junction depth of the first source/drain region 126 is determined by P, and is deeper than the junction depth of the second source/drain region 146. The junction depth of the first source/drain region 126 may be deepened by introducing P thereinto by ion implantation, at a larger dose than into the second source/drain region 146. Alternatively, the junction depth of the first source/drain region 126 may be deepened by introducing P thereinto by ion implantation, at a larger energy than into the second source/drain region 146. In this embodiment, the peak concentration of As in the first source/drain region 126 is substantially equal to the peak concentration of As in the second source/drain region 146.

Paragraphs below will explain procedures of manufacturing the semiconductor device 100 of this embodiment. FIGS. 2A to 4B are sectional views illustrating procedures of manufacturing the semiconductor device 100 of this embodiment.

First, in the upper portion of the semiconductor substrate 102, the cell P-well 103, the P-well 104, and the N-well 105 are formed while being isolated from each other by the element isolation insulating layer 106. The element isolation insulating layer 106 may be configured typically by a silicon oxide film. Alternatively, the element isolation insulating layer 106 may be configured to have a liner film, such as a silicon nitride film, formed over the bottom surface and the side face thereof.

Next, a gate insulating film (not illustrated) is formed over the entire surface of the semiconductor substrate 102. The gate insulating film may be composed of a silicon oxide film, a high-k film, or a stacked film composed of these films.

Next, a polysilicon layer is formed over the entire surface of the semiconductor substrate 102, typically by CVD (Chemical Vapor Deposition) process. Next, the polysilicon layer and the gate insulating film are sequentially patterned to form the gate electrodes, by publicly-known lithographic and etching techniques. By this process, the first gate electrodes 121, the second gate electrode 141, and the third gate electrode 161 are formed in the DRAM region 200, the NMOS region 212, and the PMOS region 214, respectively.

Figure 2A:
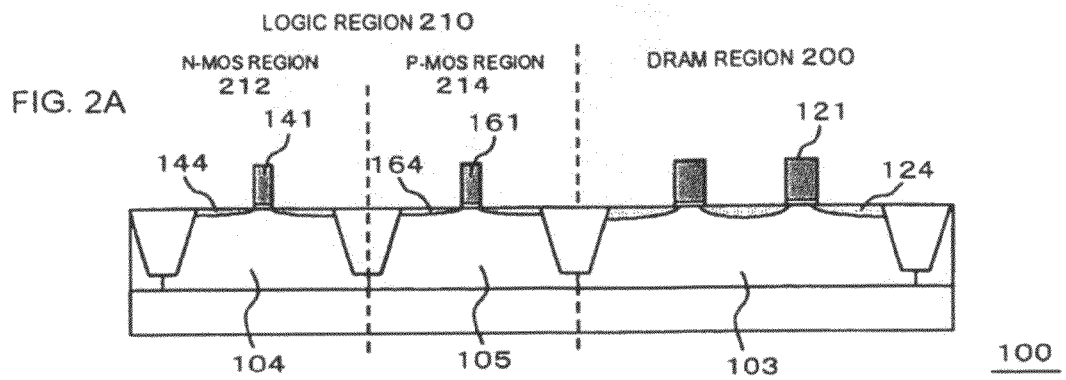
FIGS. 2A to 4B are sectional views illustrating procedures of manufacturing the semiconductor device in one embodiment of the present invention.

Thereafter, impurities are introduced by ion implantation into the semiconductor substrate 102, using the first gate electrodes 121, the second gate electrode 141, and the third gate electrode 161 as a mask, to thereby form a first extension region 124, a second extension region 144, and a third extension region 164 respectively so as to form an LDD (lightly doped drain) structure (FIG. 2A). The first extension region 124 in the DRAM region 200 may be formed by ion implantation of P at 10 keV and 1E13 cm$^{-2}$. The second extension region 144 in the NMOS region 212 may be formed by ion implantation of BF$_2$ at 35 keV and 2.7E13 cm$^{-2}$, and As at 2 keV and 8E14 cm$^{-2}$. The third extension region 164 of the PMOS region 214 may be formed by ion implantation of As at 65 keV, 2.1E13 cm$^{-2}$, and BF$_2$ at 2 keV and 8E14 cm$^{-2}$.

Figure 2B:
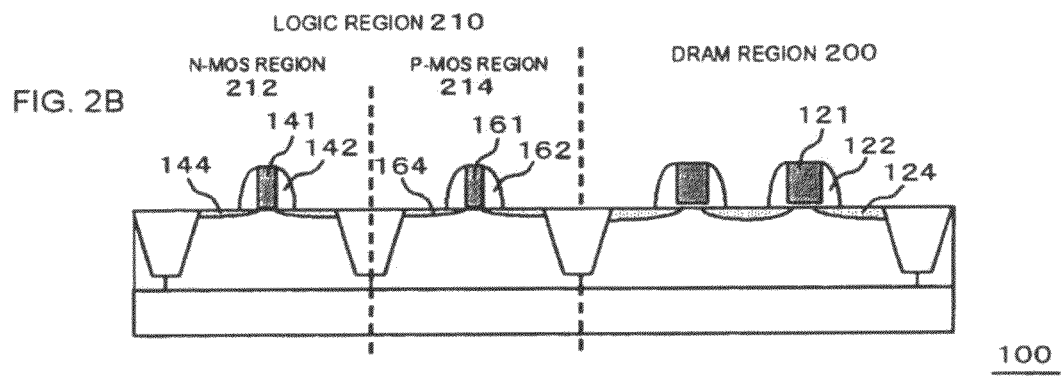

Next, sidewalls 122, sidewalls 142, and sidewalls 162 are formed on the side faces of the first gate electrodes 121, the second gate electrode 141, and the third gate electrode 161, respectively (FIG. 2B). The sidewalls may be formed typically by a silicon nitride film.

Figure 3A:
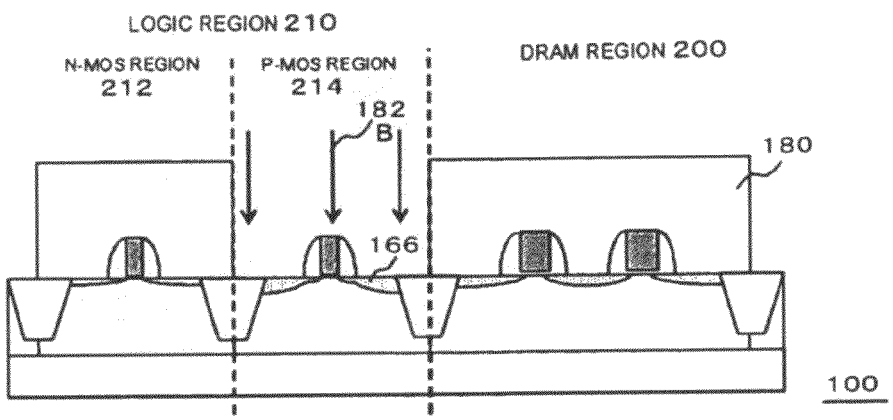

Next, a resist film 180 is formed so as to mask the DRAM region 200 and the NMOS region 212, and boron (B or BF$_2$) 182 is introduced as an impurity by ion implantation into the PMOS region 214, to thereby form the third source/drain region 166 (FIG. 3A). The third source/drain region 166 herein may be formed typically by introducing B by ion implantation at 2.3 keV and 5E15 cm$^{-2}$.

Figure 3B:
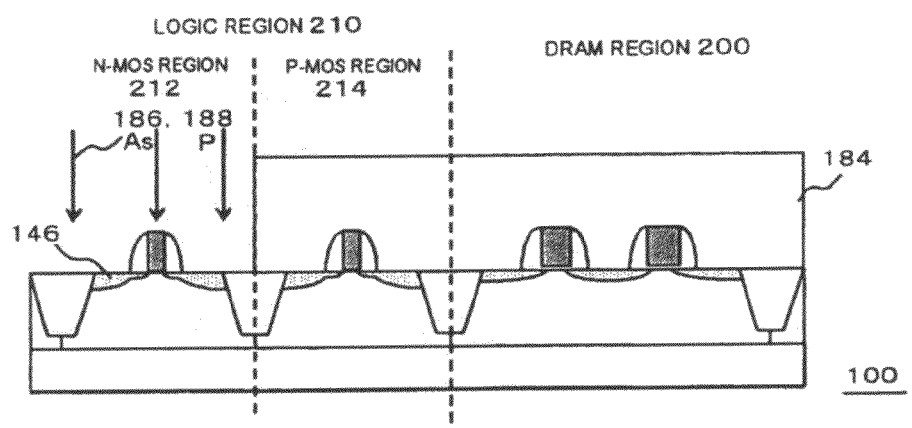

Thereafter, a resist film 184 is formed so as to mask the DRAM region 200 and the PMOS region 214, and arsenic 186 and phosphorus 188 are introduced as the impurities by ion implantation into the NMOS region 212 to thereby form the second source/drain region 146 (FIG. 3B). Arsenic 186 herein may be introduced by ion implantation typically at 5 keV to 15 keV, and 6E14 cm$^{-2}$ to 4E15 cm$^{-2}$. Phosphorus 188 herein may be introduced by ion implantation typically at 5 keV to 20 keV, and 1E14 cm$^{-2}$ to 5E15 cm$^{-2}$. In one exemplary case, the second source/drain region 146 may be formed by introducing arsenic 186 by ion implantation at 8 keV and 2E15 cm$^{-2}$, and phosphorus 188 at 8.5 keV and 1.5E15 cm$^{-2}$.

Figure 4A:
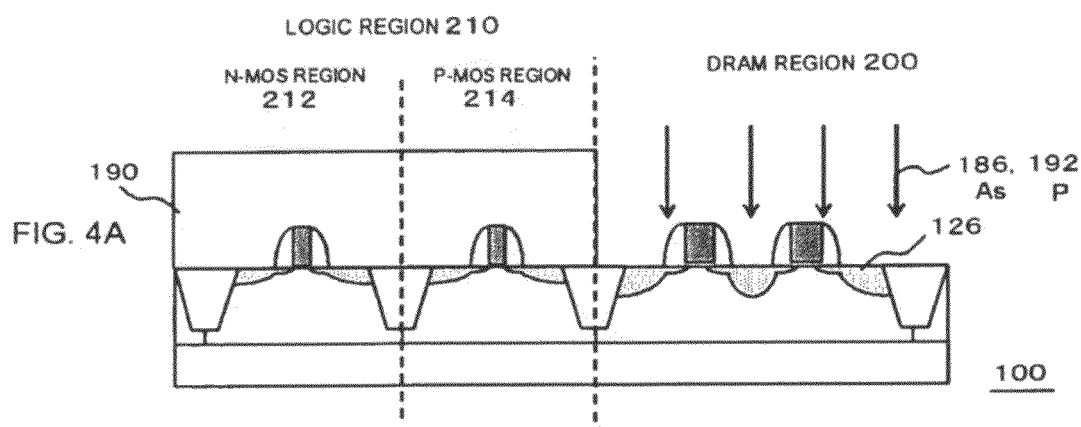

Next, a resist film 190 is formed so as to mask the NMOS region 212 and the PMOS region 214, and arsenic 186 and phosphorus 192 are introduced as impurities by ion implantation into the DRAM region 200 to thereby form the first source/drain region 126 (FIG. 4A). Arsenic 186 herein may be introduced by ion implantation typically under conditions similar to those in the process of formation of the second source/drain region 146. More specifically, arsenic 186 may be introduced by ion implantation typically at 5 keV to 15 keV, and 6E14 cm$^{-2}$ to 4E15 cm$^{-2}$. On the other hand, phosphorus 192 may be introduced by ion implantation at a higher dose and/or higher energy as compared with those in the process of formation of the second source/drain region 146. Phosphorus 192 may be introduced by ion implantation typically at 5 keV to 30 keV, and 6E14 cm$^{-2}$ to 7E15 cm$^{-2}$. In one exemplary case, the first source/drain region 126 may be formed by introducing arsenic 186 at 8 keV and 2E15 cm$^{-2}$, and phosphorus 192 at 10 keV and 3E15 cm$^{-2}$ by ion implantation.

Thereafter, the product is annealed at approximately 1000° C. so as to activate the impurity-diffused layers. The individual impurities diffuse in the process of annealing, making the junction depth of the first source/drain region 126 introduced with phosphorus 192, deeper than that of the second source/drain region 146 introduced with phosphorus 188.

Figure 5A:
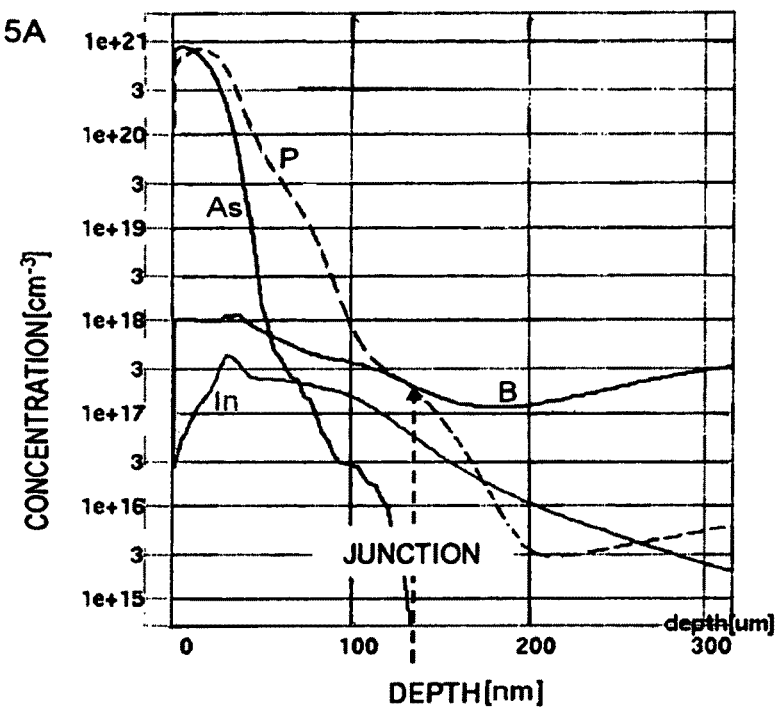
FIGS. 5A and 5B are drawings illustrating concentrations of the individual impurities contained in the first source/drain region of the DRAM region, and in the second source/drain region of the NMOS region of the logic region.
Figure 5B:
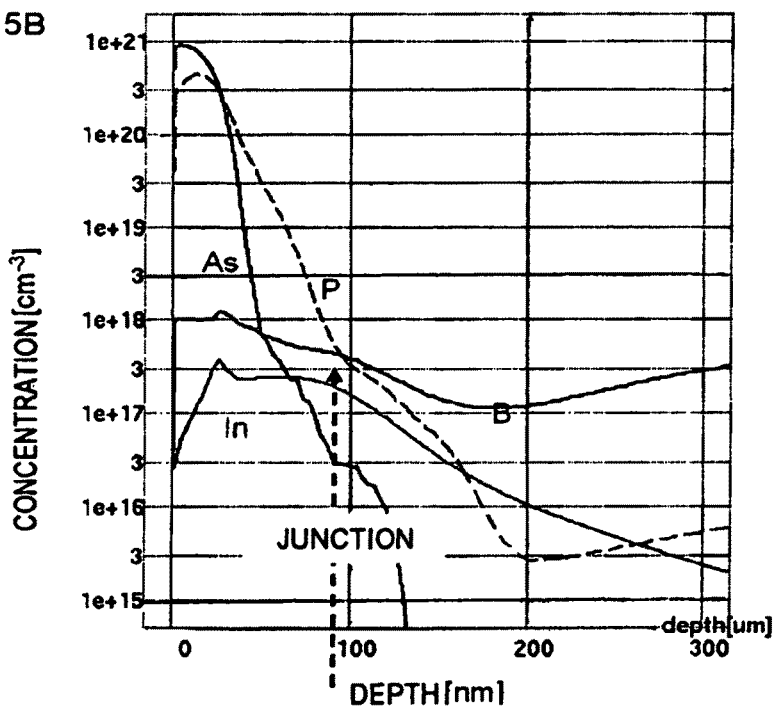
Figure 6A:
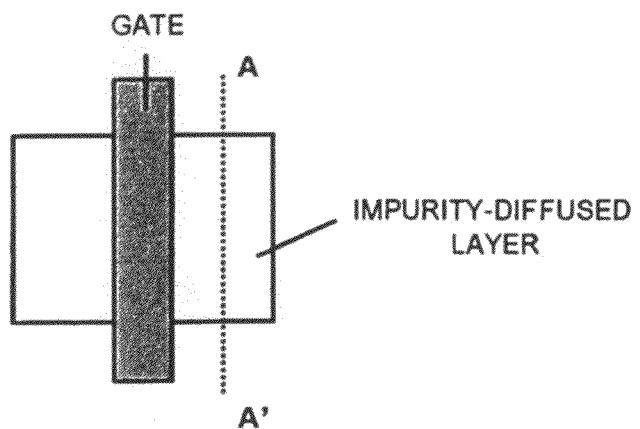
FIGS. 6A and 6B are drawings schematically illustrating a configuration of an impurity-diffused layer of a transistor.
Figure 6B:
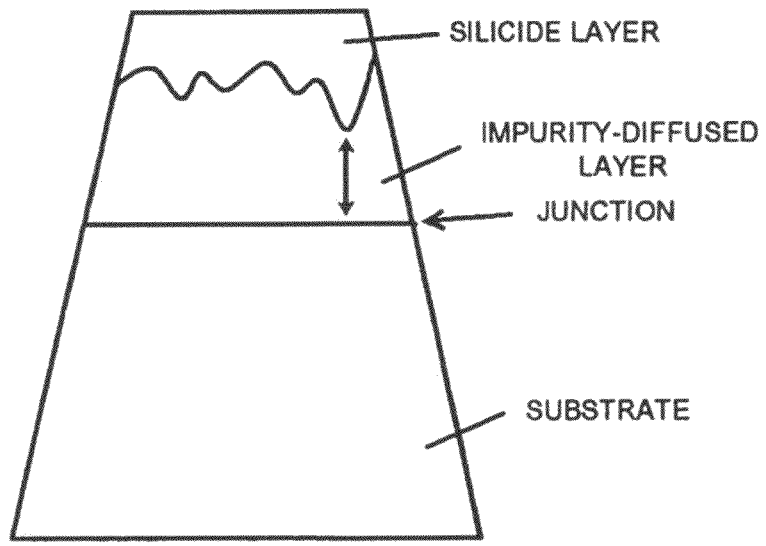

FIGS. 5A and 5B are drawings respectively illustrating results of impurity concentrations in the first source/drain region 126 in the DRAM region 200, and in the second source/drain region 146 in the NMOS region 212, obtained by device simulation. FIG. 5A illustrates the individual impurity concentrations in the first source/drain region 126, and FIG. 5B illustrates the individual impurity concentrations in the second source/drain region 146.

As illustrated in the drawings, in both of the first source/drain region 126 and the second source/drain region 146, P diffuses to deeper levels as compared with As. Points of intersection of concentration curves of the n-type impurity (As+P) and p-type impurity (In +B) indicate the individual junction depth. From the drawings, the junction depth of the second source/drain region 146 is found to be approximately 90 nm, whereas the junction depth of the first source/drain region 126 may be deepened to approximately 120 nm.

Figure 4B:
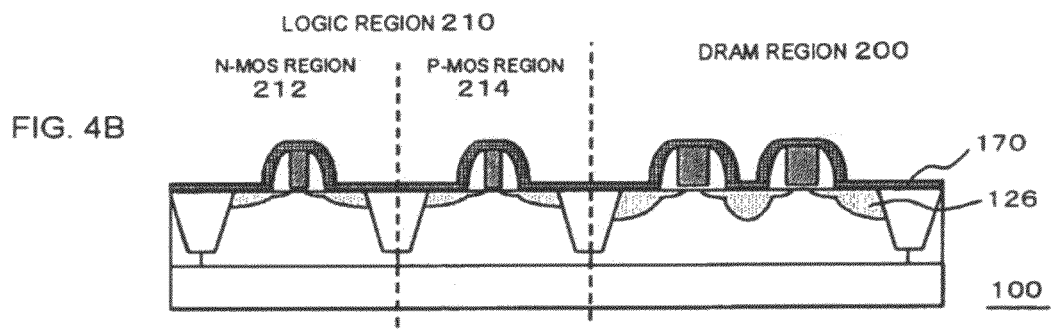

Next, a metal layer 170 is formed over the entire surface of the semiconductor substrate 102 (FIG. 4B). In this embodiment, the metal layer 170 is composed of nickel or cobalt. The metal layer 170 may be formed by sputtering. Next, the metal layer 170 and silicon brought into contact therewith are allowed to react by annealing, to thereby form the silicide layers. By the process, as illustrated in FIG. 1, the silicide layer 172 is formed on the upper surface of the semiconductor substrate 102, and the silicide layers 174 are formed on the upper surfaces of the individual gate electrodes. The silicide layers may be composed of NiSi or CoSi$_2$, for example.

By virtue of the above-described configuration, the junction depth of the first source/drain region 126 of the first transistor 120 in the DRAM region 200 may selectively be made deeper, so that the amount of leakage may be reduced even if the silicide layer 172 is formed over the first source/drain region 126. In addition, in the logic region 210, the length of the gate of transistors may be shortened by making the junction depth shallower, and thereby high speed operation may be enabled.

According to the semiconductor device 100 of this embodiment, the first transistor 120 and the second transistor 140 are respectively given with desirable characteristics, by varying the P concentration, even if the As concentration is kept in a desirable range.

The embodiment of the present invention has been described in the above referring to the attached drawings, only for the purpose of exemplifying the present invention, while allowing adoption of any various configurations other than those described in the above.

The embodiment in the above described a configuration in which also the second source/drain region 146 contains P (phosphorus), whereas the second source/drain region 146 may also be configured without containing P.

The first source/drain region 126 and the second source/drain region 146 in the above-described embodiment are separately introduced with impurities by ion implantation, whereas another possible process may be such as introducing As simultaneously into the DRAM region 200 and the NMOS region 212 of the logic region 210, followed by introduction of P only into the DRAM region 200; or the DRAM region 200 and the NMOS region 212 may separately be introduced with P.

Still alternatively, the DRAM region 200 and the NMOS region 212 of the logic region 210 may be introduced with As and P at the same time, followed by introduction of P only into the DRAM region 200, so as to raise the P concentration in the DRAM region 200.

The configuration of the transistor is not limited to that explained in this embodiment, and allows, for example, adoption of a metal material in place of polysilicon as a material for composing the gate electrodes.

It is apparent that the present invention is not limited to the above embodiment, that may be modified and changed without departing from the scope and spirit of the invention.

What is claimed is:

1. A semiconductor device comprising a DRAM region and a logic region embedded together therein, said semiconductor comprising:
    a substrate comprising said DRAM region and said logic region formed therein;
    a first transistor formed in said DRAM region of said substrate, and comprising a first source/drain region, said first source/drain region comprising:
        a first impurity ion; and
        a second impurity ion different from said first impurity ion; and
    a second transistor formed in said logic region of said substrate, and comprising a second source/drain region, said second source/drain region comprising:
        said first impurity ion; and
        said second impurity ion,
    wherein each of said first source/drain region and said second source/drain region of said substrate comprises a suicide layer respectively formed in a surficial portion thereof,
    said first source/drain region has a deepest junction depth which is determined by said first impurity ion contained by said first source/drain region,
    said second source/drain region has a deepest junction depth which is determined by said first impurity ion contained by said second source/drain region, and
    said deepest junction depth of said first source/drain region is deeper than said deepest junction depth of said second source/drain region.

2. The semiconductor device as claimed in claim 1, wherein said first source/drain region has a peak concentration of said second impurity ion substantially equal to a peak concentration of said second impurity ion of said second source/drain region.

3. The semiconductor device as claimed in claim 1, wherein said second impurity ion comprises one of arsenic and indium, and said first impurity ion comprises one of phosphorous and boron.

4. The semiconductor device as claimed in claim 1, wherein said first source/drain region has a peak concentration of said first impurity ion larger than a peak concentration of said first impurity ion of said second source/drain region.

5. A method of manufacturing a semiconductor device comprising a DRAM region and a logic region embedded together therein, the method comprising:
    forming a gate electrode in each of said DRAM region and said logic region formed in a substrate;
    introducing a first impurity ion and a second impurity ion different from said first impurity ion, by ion implantation, into said logic region and into said DRAM region, while using said gate electrode as a mask;
    allowing said first impurity ion and said second impurity ion to diffuse by annealing, to thereby form a first source/drain region and a second source/drain region respectively in said DRAM region and said logic region; and
    forming a silicide layer in a surficial portion of each of said first source/drain region and said second source/drain region,
    wherein in said introducing said first impurity ion and said second impurity ion, by ion implantation, said first impurity ion is introduced to said DRAM region at a first energy and said first impurity ion is introduced to said logic region at a second energy different from said first energy, so that from said introducing, a deepest junction depth in said first source/drain region is deeper than a deepest junction depth in said second source/drain region.

6. The method of manufacturing a semiconductor device as claimed in claim 5, wherein said first source/drain region has a peak concentration of said second impurity ion substantially equal to a peak concentration of said second impurity ion of said second source/drain region.

7. The method of manufacturing a semiconductor device as claimed in claim 5, wherein said introducing said first impurity ion and said second impurity ion by ion implantation includes:
    introducing said first impurity ion and said second impurity ion into said logic region by ion implantation, while masking said DRAM region, and while using said gate electrode in said logic region as a mask; and
    introducing said first impurity ion and said second impurity ion into said DRAM region by ion implantation, while masking said logic region, and while using said gate electrode in said DRAM region as a mask.

8. The method of manufacturing a semiconductor device as claimed in claim 5, wherein in said introducing said first impurity ion and said second impurity ion by ion implantation, said first impurity ion comprises phosphorous.

9. The method of manufacturing a semiconductor device as claimed in claim 5, wherein in said introducing said first impurity ion and said second impurity ion by ion implantation, said first impurity ion is introduced into said DRAM region at a dose higher than a dose at which said first impurity ion is introduced into said logic region.

10. The method of manufacturing a semiconductor device as claimed in claim 5, wherein said introducing said first impurity ion and said second impurity ion by ion implantation includes:
    introducing said first impurity ion and said second impurity ion by ion implantation, simultaneously into said DRAM region and said logic region; and
    selectively introducing said first impurity ion into said DRAM region by ion implantation, while masking said logic region, and while using said gate electrode in said DRAM region as a mask.

* * * * *